US 6,891,389 B1

(12) United States Patent
Walker et al.

(10) Patent No.: US 6,891,389 B1
(45) Date of Patent: May 10, 2005

(54) SYSTEM AND METHOD FOR DETECTING QUIESCENT CURRENT IN AN INTEGRATED CIRCUIT

(75) Inventors: Duncan M. Walker, College Station, TX (US); Hoki Kim, Fishkill, NY (US)

(73) Assignee: The Texas A&M University System, College Station, TX (US)

(*) Notice: Subject to any disclaimer, the term of this patent is extended or adjusted under 35 U.S.C. 154(b) by 459 days.

(21) Appl. No.: 09/997,786

(22) Filed: Nov. 30, 2001

Related U.S. Application Data
(60) Provisional application No. 60/250,735, filed on Dec. 1, 2000.

(51) Int. Cl.[7] .............................................. G01R 31/02
(52) U.S. Cl. ..................................... 324/763; 324/759
(58) Field of Search ................................ 324/763, 764, 324/759, 750, 755, 158.1; 331/11, 25, 43, 117; 327/159, 160

(56) References Cited

U.S. PATENT DOCUMENTS

| | | | |
|---|---|---|---|
| 4,677,380 A | | 6/1987 | Popovic et al. ............. 324/252 |
| 5,570,034 A | | 10/1996 | Needham et al. ........... 324/763 |
| 5,850,129 A | * | 12/1998 | Yoshino ...................... 318/254 |
| 6,404,291 B1 | * | 6/2002 | Riley ........................... 331/11 |

OTHER PUBLICATIONS

J. Lin and M. Milkovic, "Performance Limitations of Stochastic Sensors," *Midwest Symposium on Circuits and Systems*, Aug. 1992.

P. Nigh, W. Needham, K. Butler, P. Maxwell and R. Aitken, An Experimental Study Comparing the Relative Effectiveness of Functional, Scan, IDDq and Delay–fault Testing, *IEEE Int'l ASIC Conference*,1996.

J. Rius and J. Figueras, "Dynamic Characterization of Built–In Current Sensors Based on PN Junctions: Analysis and Experiments," *Journal of Electronic Testing: Theory and Applications*, vol. 9, No. 3, Dec. 1996.

J.M. Soden and C.F Hawkins, "$I_{DDQ}$ Testing and Defect Classes—A Tutorial," *IEEE Custom Integrated Circuits Conference*, 1995.

K.M. Wallquist, "On the Effect of $I_{SSQ}$ Testing in Reducing Early Failure Rate," *IEEE Int'l Test Conference*, 1995.

T.R. Henry and T. Soo, "Burn–In Elimination of a High Volume Microprocessor Using $I_{DDQ}$," *IEEE Int'l Test Conference*, 1996.

T.W. Williams, R. Kapur, M.R. Mercer, R.H. Dennard and W. Maly, Iddq Test: Sensitivity Analysis of Scaling, *IEEE Int'l Test Conference*, 1996.

D.M.H. Walker, "Requirements for Practical $I_{DDQ}$ Testing of Deep Submicron Circuits," *IEEE Int'l Workshop on Defect Based Training*, Apr. 2000.

P.C. Maxwell, R.C. Aitken, K.R. Kollitz and A.C. Brown, "IDDQ and AC Scan: The War Against Unmodelled Defects," *IEEE Int'l Test Conference*, 1996.

T. Meneghini and D. Josephson, "$I_{DDQ}$ Testing of a 180MH$_z$ HP PA–RISC Microprocessor with Redundancy Programmed Caches," *IEEE Int'l Workshop on IDDQ Testing*, Nov. 1997.

(Continued)

*Primary Examiner*—Kamand Cuneo
*Assistant Examiner*—Trung Q. Nguyen
(74) *Attorney, Agent, or Firm*—Baker Botts L.L.P.

(57) ABSTRACT

A method for detecting quiescent current in an integrated circuit is provided that includes detecting a magnetic field generated by the quiescent current and in response generating a magnetic field signal that is indicative of the detected magnetic field. The magnetic field signal is then amplified and converted into a differential voltage signal. The differential voltage signal is then converted into a digital format.

29 Claims, 4 Drawing Sheets

OTHER PUBLICATIONS

P. Nigh, D. Vallett, A. Patel and J. Wright, "Failure Analysis of Timing and IDDq–only Failures from the SEMATECH Test Methods Experiment," *IEEE Int'l Test Conference*, 1998.

T.A. Unni and D.M.H. Walker, Model–Based $I_{DDQ}$ Pass/Fail Limit Setting, *IEEE Int'l Workshop on IDDQ Testing*, Nov. 1998.

A.E. Gattiker and W. Maly, "Current Signatures: Application," *IEEE Int'l Test Conference*, 1997.

C. Thibeault, "On the Comparison of Δ $I_{DDQ}$ and $I_{DDQ}$ Testing," *IEEE VLSI Test Symposium*, Apr. 1999.

C. Thibeault, "An Histogram Based Procedure for Current Testing of Active Defects," *IEEE Int'l Test Conference*, 1999.

A.C. Miller, "IDDQ Testing in Deep Submicron Integrated Circuits," *IEEE Int'l Test Conference*, 1999.

P. Maxwell, P. O'Neill, R. Aitken, R. Dudley, N. Jaarsma, M. Quach and D. Wiseman, "Current Ratios: A Self–Scaling Technique for Production IDDQ Testing," *IEEE Int'l Test Conference*, 1999.

S. Jandhyala, H. Balachandran, S. Menon and A. Jayasumana, "Clustering Based Identification of Faulty ICs Using $I_{DDQ}$ Tests," *IEEE Int'l Workshop on IDDQ Testing*, Nov. 1998.

S. Jandhyala, H. Balachandran, A.P. Jayasumana, "Clustering Based Techniques for $I_{DDQ}$ Testing," *IEEE Int'l Test Conference*, 1999.

S. Hentschke, S. Rohrer and N. Reifschneider, "Stochastic Magnetic Field Micro–Sensor," *IEEE Int'l ASIC Conference*, 1996.

J.P.M. van Lammeren, "$I_{CCQ}$: a Test Method for Analogue VLSI Based on Current Monitoring," *IEEE Int'l Workshop on IDDQ Testing*, 1997.

K. Nose and T. Sakurai, Micro IDDQ Test Using Lorentz Force MOSFET's, *IEEE Symposium on VLSI Technology*, 1999.

F.J. Kub and C.S. Scott, "Multiple–Gate Split–Drain MOSFET Magnetic–Field Sensing Device and Amplifier," *International Electron Devices Meeting*, 1992.

H.–M. Yang, Y.–C. Huang, T.–F Lei, C.–L. Lee and S.–C. Chao, "High–resolution MOS Magnetic Sensor with Thin Oxide in Standard Submicron CMOS Process," *Sensors and Actuators*, vol. A57, 1996.

J.W.A. von Kluge and W.A. Langheinrich, "An Analytical Model of MAGFET Sensitivity Including Secondary Effects Using a Continuous Description of the Geometric Correction Factor G," *IEEE Transactions on Electron Devices*, vol. 46, No. 1, Jan. 1999.

S. Hentschke, "Digital Stochastic Magnetic–Field Detection," *Sensors and Actuators*, vol. A57, 1996.

H.J.M. Veendrick, "The Behavior of Flip–Flops Used as Synchronizers and Prediction of Their Failure Rate," *IEEE Journal of Solid–State Circuits*, vol. SC–15, No. 2, Apr. 1980.

A.D. Singh, "Experiments with an On–Chip IDDQ Current Sensor for VLSI Testing," *IEEE Int'l Workshop on IDDQ Testing*, 1995.

\* cited by examiner

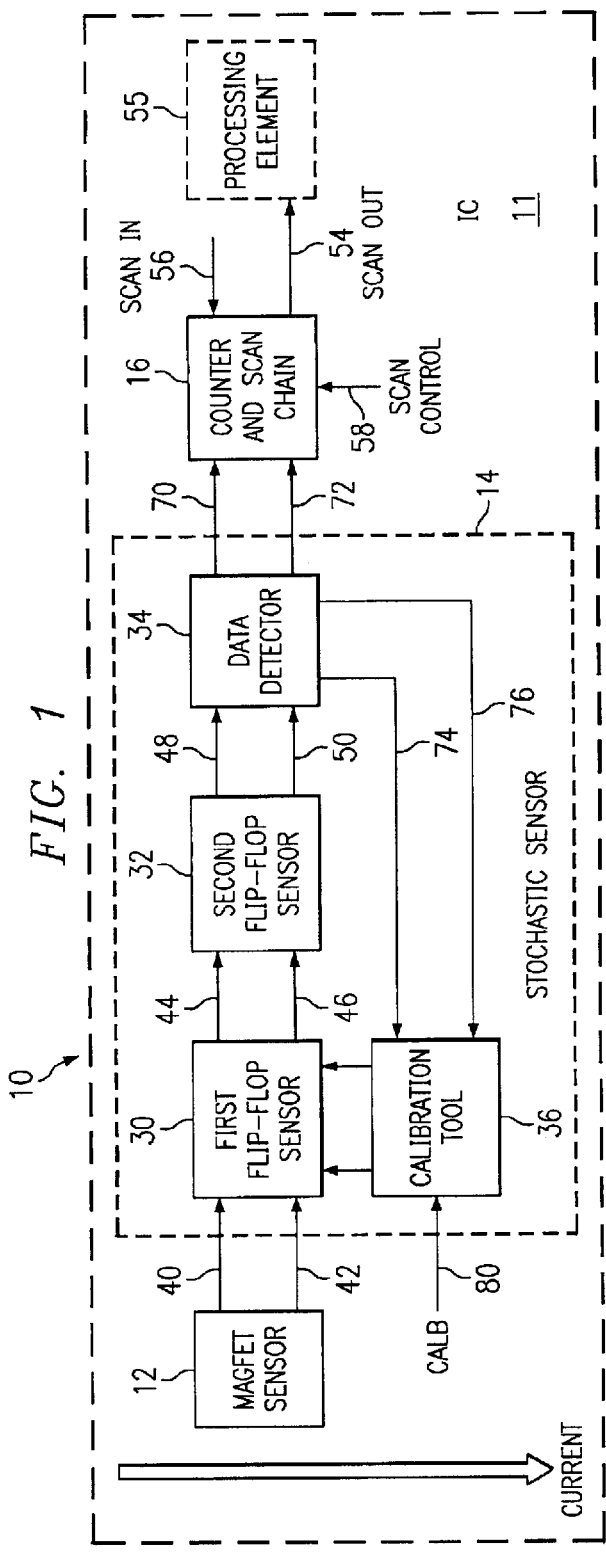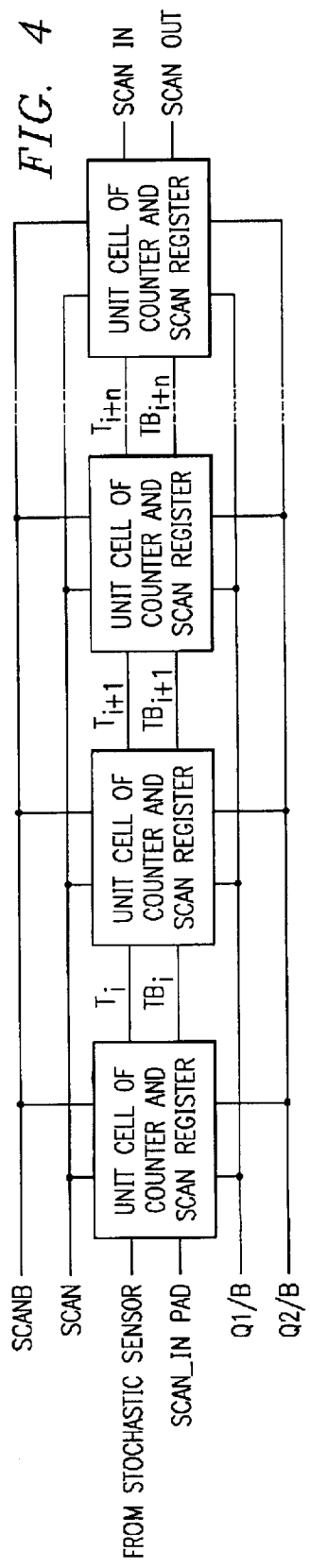

SYSTEM AND METHOD FOR DETECTING QUIESCENT CURRENT IN AN INTEGRATED CIRCUIT

RELATED APPLICATIONS

This application claims the priority under 35 U.S.C. §119 of provisional application Ser. No. 60/250,735 entitled "Current Sensor System and Method for Measuring Integrated Circuit Current (IDDQ), by Duncan M. Walker, et al., filed Dec. 1, 2001.

GOVERNMENT RIGHTS

This invention was made with government support under Grant Nos. CCR-9971192 and CCR-9406946 awarded by the National Science Foundation (NSF). Accordingly, the government has certain rights in this invention.

TECHNICAL FIELD OF THE INVENTION

This invention relates in general to current detection, and more particularly to a system and method for detecting quiescent current in an integrated circuit.

BACKGROUND OF THE INVENTION

Semiconductor manufacture and fabrication has grown increasingly more complex and important in the field of integrated circuitry. Semiconductors may have a quiescent current in some circumstances; a "quiescent current" generally refers to a leakage current produced by an integrated circuit normally, or by some defect or irregularity in the semiconductor component, device or element. Quiescent current testing and detection has similarly grown in importance in semiconductor manufacturing. Quiescent current testing is generally implemented to detect integrated circuit defects that may occur during the fabrication of various semiconductor components or elements. Quiescent current testing provides the ability to identify semiconductor processing physical defects such as: gate oxide shorts, floating gates, and bridging faults that include manufacturing errors, for example.

Quiescent current measurement is generally performed by directly inserting a measurement tool between connections or couplings of an integrated circuit and measuring a voltage drop across the measurement tool. Inserting the measurement tool directly into a connection or a coupling within an integrated circuit however leads to performance degradation and longer measurement testing times. In addition, such tools or devices that directly measure quiescent current are often large and cumbersome and occupy valuable space on the associated integrated circuit.

SUMMARY OF THE INVENTION

According to one embodiment of the present invention, a method for detecting quiescent current in an integrated circuit is provided that includes detecting a magnetic field generated by the quiescent current and in response generating a magnetic field signal that is indicative of the detected magnetic field. The magnetic field signal is then amplified and converted into a differential voltage signal. The differential voltage signal is then converted into a digital format.

Some embodiments of the present invention provide a number of technical advantages. For example, according to one embodiment of the present invention, a quiescent current detection system is provided that avoids performance degradation of an associated integrated circuit by indirectly measuring the quiescent current. This is accomplished by measuring the magnetic field generated by the quiescent current, instead of the quiescent current directly. Thus, by measuring the magnetic field the current detection system of the present invention avoids the undesirable voltage drop across itself: such voltage drops are present in other current measurement tools.

This indirect measurement of the quiescent current also eliminates the disadvantages associated with other systems in that it does not interfere with the speed of an associated integrated circuit. This too is a result of measuring the magnetic field instead of positioning a measurement tool directly in the pathway being provided to an integrated circuit. The quiescent current measurement tool of the present invention also provides the benefit of allowing quiescent current measurement that propagates in either direction through a magnetic field sensor. This may be important for use in the partitioning of a mesh-type power supply network for example, both for testing and diagnosis. In a mesh-type network, a quiescent current may flow in one direction or the other depending on manufacturing specifications. Because of the configuration of the current detection system of the present invention, the capability of measurement over a given range of quiescent values in both directions is provided, both for testing or other suitable purposes.

Another technical advantage of the present invention is its small size. Space within an integrated circuit is generally at a premium in the semiconductor manufacture industry. One embodiment of the present invention may be implemented such that 1% or less of the space of the integrated circuit is occupied by the quiescent current detection system. Additionally, the current detection system of the present invention is not only small but operates at extremely fast speeds producing an approximate test time of one millisecond per vector unit sampled or measured in one embodiment of the present invention.

Embodiments of the present invention may enjoy some, all, or none of these advantages. Other technical advantages are readily apparent to one skilled in the art from the following figures, the description, and the claims.

BRIEF DESCRIPTION OF THE DRAWINGS

Reference is made to the following description taken in conjunction with the accompanying drawings in which:

FIG. 1 is a block diagram of a quiescent current detection system in accordance with one embodiment of the present invention;

FIG. 4 is a block diagram of a counter and scan chain element included within the quiescent current detection system of FIG. 1 in accordance with one embodiment of the present invention;

DETAILED DESCRIPTION OF EXAMPLE EMBODIMENTS OF THE INVENTION

Figure 2:
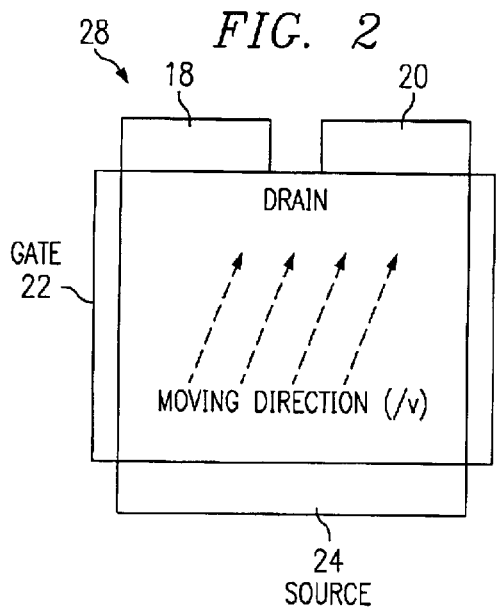
FIG. 2 is a diagrammatic view of a magnetic field effect transistor (MAGFET) configuration within the quiescent current detection system of FIG. 1 in accordance with one embodiment of the present invention.

Example embodiments of the invention are best understood by referring to FIGS. 1 through 8 of the drawings in which like numerals refer to like parts.

FIG. 1 is a block diagram of a quiescent current detection system 10 in accordance with one embodiment of the present invention. A "quiescent current" generally refers to a leakage current produced by an integrated circuit normally, or by an irregularity in the semiconductor component, device or element. Quiescent current detection system 10 includes a magnetic field effect transistor (MAGFET) sensor 12, a stochastic sensor 14, and a counter and scan chain element 16. Quiescent current detection system 10 may be coupled to or otherwise positioned on an integrated circuit 11, an integrated chip, or any other suitable semiconductor component, device or object in order to detect or identify a quiescent or a leakage current.

In accordance with the teachings of the present invention, quiescent current detection system 10 measures the quiescent current of integrated circuit 11 indirectly by measuring the magnetic field generated by the quiescent current (the direction of the quiescent current is indicated generally in FIG. 1 with an arrow). Quiescent current detection system 10 further operates to convert the measured magnetic field into a corresponding digital format and to scan the digital representation of the quiescent current out of counter and scan chain element 16. The digital representation yields a quiescent current value for the associated integrated circuit.

The operation of MAGFET sensor 12 is based on the Lorentz force exerted on moving carriers by the magnetic field generated by quiescent current flowing within an integrated circuit. MAGFET sensor 12 further uses an arrangement of cross-coupled, split-drain MAGFETs to convert this Lorentz force into a voltage differential. The voltage differential generated by the split-drain MAGFETs is converted to a digital bit stream using stochastic sensor 14. The digital bit stream then accumulates in counter and scan chain element 16. The resultant or accumulated digital bit stream may then be scanned out of counter and scan chain element 16 in order to provide a digital reading of the quiescent current value for the integrated circuit or component being tested.

Because quiescent current detection system 10 measures the quiescent current indirectly, it effectively avoids performance degradation for an associated integrated circuit. The performance of an associated integrated circuit is maintained by measuring the magnetic field generated by the quiescent current, instead of measuring the quiescent current directly through a coupling or connection in the integrated circuit. Thus, by measuring the magnetic field with quiescent current detection system 10, the present invention avoids an undesirable voltage drop across itself; this voltage drop is present in other current measurement tools.

The indirect and noninvasive measurement approach of quiescent current detection system 10 also may effectively avoid interference with the speed of an associated integrated circuit. This too is a result of measuring the magnetic field instead of positioning a current measurement tool directly in a current pathway of an associated integrated circuit. Testing times for detecting quiescent current in an integrated circuit are significantly greater for measurement tools that directly measure quiescent current because of the resulting voltage drop across the current measuring tool.

MAGFET sensor 12 implements a split-drain MAGFET configuration that indirectly measures quiescent current in accordance with the teachings of one embodiment of the present invention (this configuration is described in greater detail below with reference to FIG. 2). Alternatively, MAGFET sensor 12 may be any magnetic field detection element, component, or device that determines a magnetic field value based on current flow. MAGFET sensor 12 uses the Hall effect generated by the Lorentz force on moving carriers (e.g. electrons or holes) in a transistor channel. The moving carriers deflected by the Lorentz force generate a current difference between two drain terminals of a semiconductor element within MAGFET sensor 12, with a linear drain relationship existing between the current difference and the magnetic field produced by the quiescent current. In the presence of this Lorentz force, the carriers under a channel of a semiconductor element (such as a MOSFET for example) are forced to deviate from their normal direction, resulting in a current difference at the drains. The Lorentz force is perpendicular to both the magnetic field and the direction of the carriers. For purposes of teaching the split-drain configuration of MAGFET sensor 12, it is helpful to reference the illustration provided in FIG. 2.

FIG. 2 is a diagrammatic view of a split-drain MAGFET element 28 that is the basis for the internal circuitry of MAGFET sensor 12 in accordance with one embodiment of the present invention. Split-drain MAGFET element 28 includes two drains 18 and 20, a gate 22, and a source 24. When MAGFET sensor 12 is in the presence of a quiescent current generated by an integrated circuit, it is exposed to a magnetic field perpendicular to the surface of split-drain MAGFET element 28 such that a current imbalance results between drains 18 and 20 that is proportional to the vertical component of the magnetic field.

By implementing a split-drain MAGFET structure as illustrated in FIG. 2, which has a narrowed source and drain contact area, the current flow through split-drain MAGFET element 28 is effectively crowded into the center of the channel. This crowding increases the fraction of the current that has a chance to flow out of drains 18 and 20 and accordingly significantly improves sensitivity of split-drain MAGFET element 28. This crowding of the current flow may be further increased by placing drain contacts near a notch between drains 18 and 20. The current crowding increases the current density in the central area of the channel several times. The channel resistance, as a result, increases dramatically, and in turn, a high channel resistance for split-drain MAGFET element 28 achieves a higher output voltage gain while maintaining a low noise level. The embodiment illustrated of split-drain MAGFET element 28 in FIG. 2 may varied significantly without departing from the teachings of the present invention. Split-drain MAGFET element 28 may be configured in any other suitable way where appropriate in order to provide further sensitivity to quiescent current detection system 10, while minimizing the noise level and optimizing the voltage gain of the device.

In operation, the execution of MAGFET sensor 12 is based on the Lorentz force (as described above) on moving carriers caused by the magnetic field generated by electric current on an integrated circuit. In the presence of this Lorentz force, the carriers under the MOSFET channel are forced to deviate from their normal direction, resulting in a current difference at drains 18 and 20. As illustrated by arrows in FIG. 2, the Lorentz force will be perpendicular to both the magnetic field and the direction of the carriers. The gap between drains 18 and 20 behaves as a parasitic field transistor of high channel resistance between the two adjacent drain nodes. Current crowding caused by the Lorentz force creates a current difference between drains 18 and 20.

Referring back to FIG. 1, stochastic sensor 14 includes a first flip-flop sensor 30, a second flip-flop sensor 32, a data detector 34, and a calibration tool 36. Stochastic sensor 14 is coupled to MAGFET sensor 12 through a pair of communications links 40 and 42. Stochastic sensor 14 receives a differential voltage signal from MAGFET sensor 12 via links 40 and 42. Links 40 and 42 communicate a voltage differential signal produced by a magnetic field generated by a quiescent current flowing through an integrated circuit. Stochastic sensor 14 operates generally to convert the differential voltage signal provided by links 40 and 42 into a digital format, as described in greater detail below, that is scanned out of quiescent current detection system 10 via counter and scan chain element 16. The digital bit stream that is scanned out of counter and scan chain element 16 provides a digital reading of the quiescent current value of the integrated circuit sought to be tested by quiescent current detection system 10.

First flip-flop sensor 30 comprises a logic element that produces a binary input in response to an input signal. First flip flop element 30 receives the differential voltage signal from MAGFET sensor 12 via links 40 and 42. The inherent noise of MAGFET sensor 12 is generally larger than the voltage differential signal delivered to first flip-flop sensor 30. MAGFET sensor 12 generates a relatively small voltage signal for quiescent current values of interest for the integrated circuit. In order to convert this voltage differential signal reliably into a digital value, first flip-flop sensor 30 is employed in conjunction with second flip-flop sensor 32.

This configuration of stochastic sensor 14 presumes that the noise signal is generally larger than the voltage differential signal provided by MAGFET sensor 12. Thus, stochastic sensor 14 is used for comparing the differential voltage signal provided by MAGFET sensor 12 against random Gaussian (normal) noise on each clock cycle in order to generate a random resulting stream of binary bits. The probability that each bit is either a "0" or "1" is a function of the input signal value. (The designation of "0" as low and "1" as high is arbitrary, these designations could be reversed where appropriate.) A "1" output signal corresponds to a voltage differential signal being greater than the noise signal, and is further associated with a positive quiescent current value. The higher the quiescent current value, the greater the fraction of the output of stochastic sensor 14 is "1." First and second flip-flop sensors 30 and 32 are used to minimize the probability that each is in a metastable state, which in turn may permit faster clock rates. After first flip-flop sensor 30 flips toward either a "0" or a "1," that information is communicated to second flip-flop sensor 32, which receives this information via a set of communication links 44 and 46.

Second flip flop sensor 32 also comprises a logic element that produces a binary digit in response to an input. Second flip flop sensor 32 flips the remainder of the way toward either a "0" or a "1" based on the input received from first flip flop sensor 30. Second flip-flop sensor 32 is coupled to data detector 34 via a pair of communication links 48 and 50.

Figure 3:
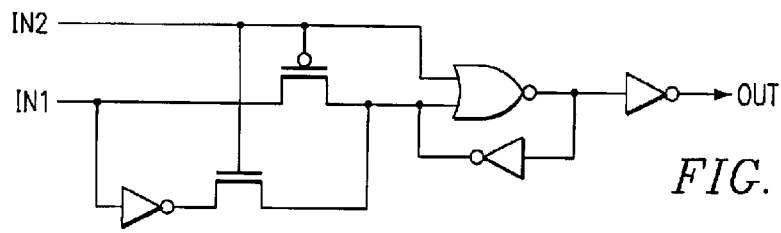
FIG. 3 is a circuit illustrating an example implementation of a data detector included within the quiescent current detection system of FIG. 1 in accordance with one embodiment of the present invention.

Data detector 34 is an interface element between second flip flop sensor 32 and counter and scan chain element 16 and further provides a set of feedback links 74 and 76 for calibration tool 36 (discussed in greater detail below). Data detector 34 receives the information from second flip-flop sensor 32 via communications links 70 and 72, but may alternatively receive information via a single link where appropriate. Data detector 34 interprets which way each of first flip-flop sensor 30 and second flip-flop sensor 32 have shifted toward. Data detector 34 uses this information to generate a digital bit stream in causing a counter within counter and scan chain element 16 to count up or not count at all (or in cases where an up-down counter is implemented, to either count up or down). FIG. 3 is a circuit illustrating an example implementation of data detector 34 included within quiescent current detection system 10 in accordance with one embodiment of the present invention. The circuit is offered only for purposes of example as data detector 34 may be implemented in any number of ways in order to provide an interface between second flip flop sensor 32 and counter and scan chain element 16. The circuit illustrated in FIG. 3 includes multiple logic gates that cooperate in order to process a signal received from second flip flop sensor 32. A single output link 51 is also illustrated in FIG. 3 (in contrast to the embodiment of FIG. 1), which provides a digital output to counter and scan chain element 16.

In the context of using an up counter, this process of flipping toward a "0" or a "1" within first flip-flop sensor 30 and second flip flop sensor 32 is repeatedly executed at a high rate of speed in order to generate a digital bit stream provided by data detector 34 that has accumulated in the counter residing in counter and scan chain element 16. The counter value generated and stored in counter and scan chain element 16 is equal to the number of clock cycles times the probability of getting a "0" or a "1" out of either of first flip-flop sensor 30 or second flip-flop sensor 32. This in turn corresponds to the digital value of the output of MAGFET sensor 12 on communication links 40 and 42, which in turn reflects the presence or lack thereof of a magnetic field generated by a potential leakage or quiescent current on an integrated circuit. Additional details related to stochastic sensor 14, inclusive of calibration tool 36 are provided below with reference to FIG. 7.

Counter and scan chain element 16 is a communications interface capable of binary processing that includes a clock for counting or shifting of the binary information received from data detector 34. Although counter and scan chain element is provided as a single component, a counter and a scan register may be provided independently in accordance with the teachings of the present invention. The counter, which resides in counter and scan chain element 16, produces a result that represents the relative magnitude of the quiescent current compared to a reference current. When the counter value is greater than half the number of cycles, this represents that the quiescent current is greater than the reference current ($I_{REF}$ as illustrated in FIG. 6B). The scan chain provided in counter and scan chain element 16 may be used to send the counter value outside the integrated circuit or chip. During the scanning mode, the counter operates as a scan in register and is reset to "0." During normal operation of stochastic sensor 14, the counter within counter and scan chain element 16 operates as a counter, and in a successive scan out mode, outputs the counter results serially as a scan register.

Binary information may be scanned out of counter and scan chain element 16 through a scan-out link 54. Scan-out link 54 provides a digital representation of the magnetic field detected by MAGFET sensor 12 (and produced by a quiescent current) and is provided in a serial format. Scan-out communications link 54 may operate to feed a pin on an integrated circuit chip or alternatively, provide a link from the chip to quiescent current detection system 10 or to a processing element 55. Processing element 55 may be a processor operable to further manipulate information received from scan-out communications link 54, or alternatively, processing element 55 may be any component, device or element operable to receive information from scan-out communications link 54 and process or otherwise communicate the information to a next destination.

Additionally, counter and scan chain element 16 includes a scan in communications link 56. As binary information is scanned out of counter and scan chain element 16, a series of zeros are provided to counter and scan chain element 16 via scan in communications link 56 in order to reset counter and scan chain element 16. Counter and scan chain element 16 may also include a scan control input 58 that represents a series of counter and scan chain elements 16 that are coupled or daisy-chained together for purposes of detecting quiescent current in an integrated circuit. Alternatively, scan control line 58 may provide a scan line from an outside or external source or provide a reference point from which to measure the presence of quiescent current. In the case where it is preferred not to have a single quiescent current detection system 10 coming from an integrated circuit chip, a series of MAGFET sensors 12 may be provided in order to create one long counter and scan chain element 16.

Figure 5A:
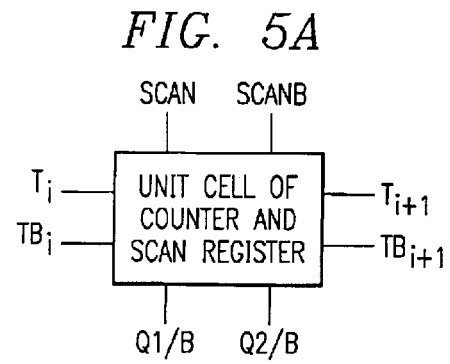
FIG. 5A is a block that illustrates a scan element block included within the quiescent current detection system of FIG. 1 in accordance with one embodiment of the present invention.
Figure 5B:
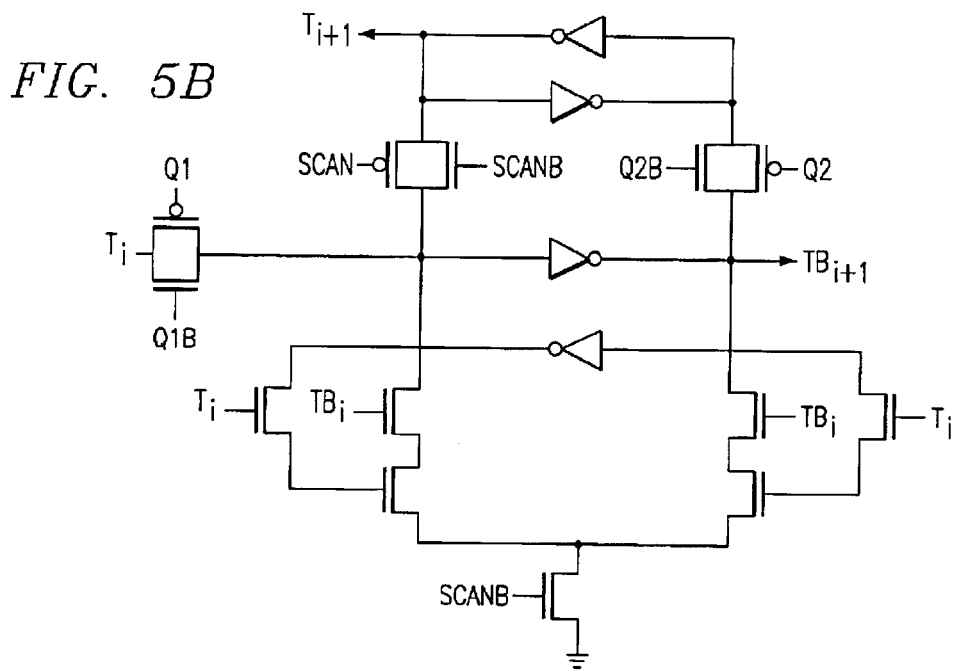
FIG. 5B is a circuit illustrating an example implementation of a counter and scan element included within the quiescent current detection system of FIG. 1 in accordance with one embodiment of the present invention.

For purposes of teaching the present invention, FIG. 4 is provided, which illustrates an example implementation of counter and scan chain element 16. Multiple unit cells 53 of an example counter and scan register are provided as coupled together in order to facilitate the detection of quiescent current within an integrated circuit. Additionally, FIG. 5A is a block illustrating additional details of a single unit cell 53 in accordance with one embodiment of the present invention. The embodiment of FIG. 5A illustrates an iteration for an example scan register and the scalability of multiple unit cells 53. FIG. 5B is an example circuit that illustrates one implementation of counter and scan element 16 that is included within quiescent current detection system 10. Multiple units 53 are provided in the embodiment illustrated in FIG. 5B. The circuit operates to provide an interface capable of binary processing that includes a clock for counting or shifting of the binary information received from data detector 34.

Figure 6A:
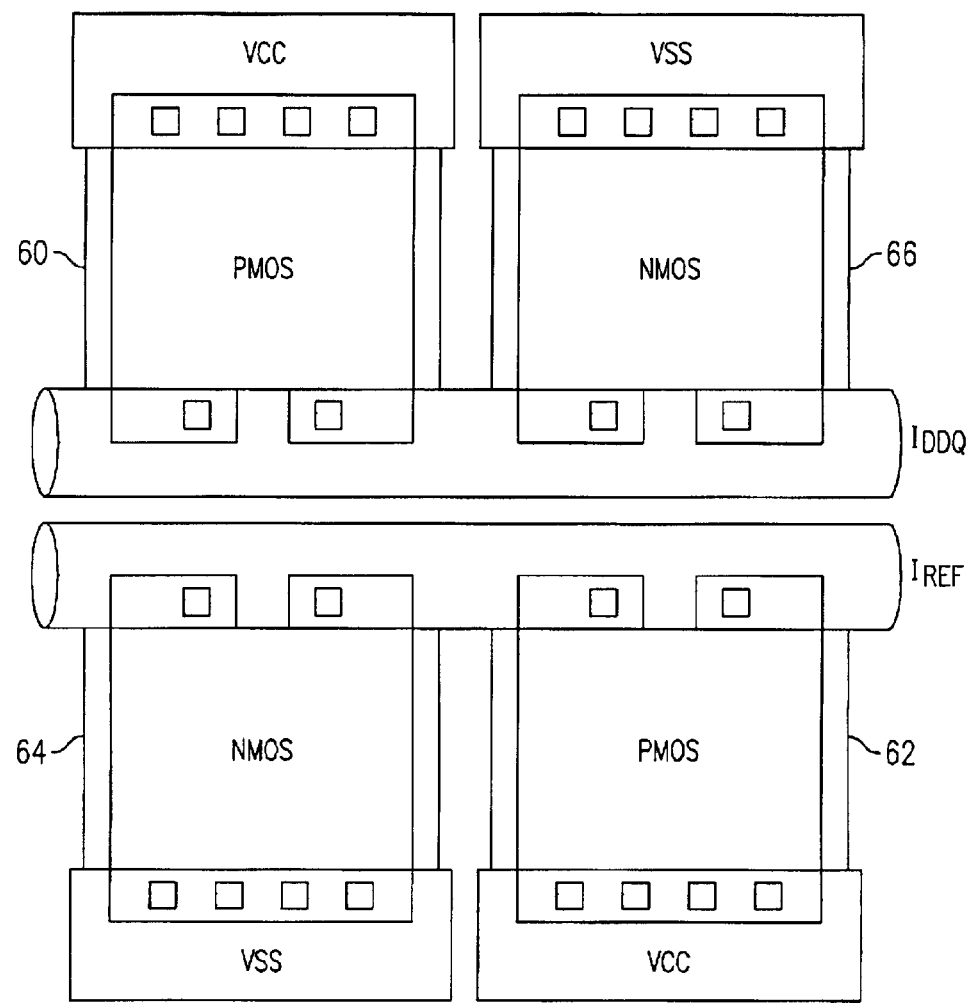
FIG. 6A is a diagrammatic view of a pair of cross-coupled P-type and N-type MAGFETs included within the quiescent current detection system of FIG. 1 in accordance with one embodiment of the present invention.
Figure 6B:
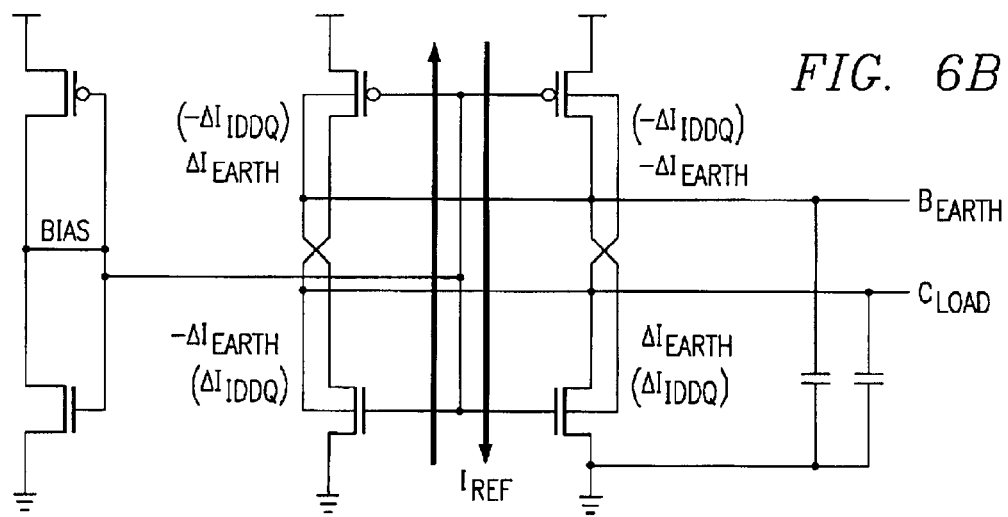
FIG. 6B is a circuit that illustrates one embodiment of the corresponding cross-coupled configuration of FIG. 6A.

Turning to FIG. 6A, FIG. 6A illustrates additional details associated with MAGFET sensor 12 of quiescent current detection system 10 in accordance with one embodiment of the present invention. The structure illustrated in FIG. 6A is similar to the structure provided in FIG. 2 with the exception of multiple MAGFETs being provided in a cross-coupled fashion. FIG. 6B is a circuit that illustrates generally the block diagram of FIG. 6A and is provided for example purposes only in teaching the present invention. FIG. 6B also illustrates a low-pass filter coupled to a selected one of the outputs of MAGFET sensor 12. The low-pass filter is operable to reduce all background noise, including noise associated with the integrated circuit and noise generated by a MAGFET within quiescent current detection system 10.

In accordance with one embodiment of the present invention, a pair of PMOS MAGFETs 60 and 62 and a pair of NMOS MAGFETs 64 and 66 are positioned adjacent to each other. As illustrated in FIG. 6A, the MAGFETs are organized in a cross-coupled fashion where PMOS 60 and NMOS 66 are provided as one device and where NMOS 64 and PMOS 62 are provided as another device. These MAGFET elements are oriented and their drains connected such that for a given magnetic field generated by a quiescent current on an integrated circuit, the drain of one type of MAGFET (such as PMOS 60) produces an increased current and is accordingly connected to the drain of another type of MAGFET (such as NMOS 66) having a decreased current. The current difference between these two outputs may then be added in order to generate a greater current differential.

Within the cross-coupled configuration illustrated in FIG. 3, each MAGFET 60, 62, 64, and 66 may be biased in order to be in saturation so that its sensitivity will be relatively constant over a predetermined output voltage range. Furthermore, this saturation is provided such that the load resistance is high and the voltage sensitivity is increased. Each of MAGFETs 60, 62, 64 and 66 are provided a bias voltage by an inverter having its input tied to its output (as illustrated in FIG. 6B). The bias voltage generated by the inverter with input and output connected insures that both PMOS MAGFET 60 and PMOS MAGFET 62, as well as NMOS MAGFET 64 and NMOS MAGFET 66 are operating in a saturation region. Thus, when both devices are in saturation, a small current deviation from either device gives rise to a large voltage difference due to the high output impedance.

In order to optimize the operation of quiescent current detection system 10, MAGFET sensor 12 should have a high gain and a low noise value. One approach is to increase the gain (as described above) using the cross-coupled configuration, which is biased and which produces a high output impedance. Another approach that may be used to increase the gain of MAGFET sensor 12 relates to increasing the strength of the magnetic field applied to each of MAGFETs 60, 62, 64 and 66. The magnetic field strength is inversely proportional to the distance away from a current source. To maximize the magnetic field strength at the associated MAGFET, the layer carrying the quiescent current may be positioned such that an upward or a downward force is exerted on the carriers. The conductor is positioned such that the perpendicular magnetic field is maximized; this may be achieved with the conductor's bottom edge just above gate 22 of the MAGFET (as illustrated in FIG. 2). In addition, the Lorentz force is proportional to the carrier velocity. This velocity is highest in a transistor channel near the drain, and thus MAGFETs 60, 62, 64 and 66 may be oriented so that their drains are adjacent to the quiescent current source. In this respect, the highest velocity carriers see the strongest magnetic field, maximizing the Lorentz force and thus, the current difference.

The internal cross-coupling structure provided within MAGFET sensor 12 provides the benefit of allowing current measurement in either direction. This is due to the noninvasive measurement of the quiescent current of an associated integrated circuit. This may be important for use in partitioning a mesh-type power supply network for example, both for testing and diagnosis. In a mesh-type network, a quiescent current may flow in one direction or the other depending on manufacturing specifications. Thus, because of the configuration of quiescent current detection system 10, the capability of measurement over a given range of quiescent values in both directions is provided, both for testing or other suitable purposes.

The quiescent current range of interest for MAGFET sensor 12 generates a relatively small magnetic field. This magnetic field is potentially smaller than the Earth's magnetic field or smaller than magnetic fields generated by nearby electrical equipment. In order to cancel out these external magnetic fields, the cross-coupling configuration (as illustrated in FIG. 3 and described above with reference thereto) is implemented. Because the magnetic field generated by the quiescent current is in the opposite direction of each pair of MAGFETs 60 and 66 and 62 and 64, their respective differential signals have approximately the same value. However, an external common-mode field results in opposite differential signals, thus the external field does not result in a net signal associated with MAGFET sensor 12.

In addition to the external noise considerations described above, intrinsic noise is also a factor in configuring MAGFETs 60, 62, 64, and 66 as illustrated in FIG. 6A. Intrinsic noise may be generated by MOSFET circuitry included within quiescent current detection system 10. The two major noise components associated with such MOSFET technology are classified as flicker noise (1/f) and thermal noise. Flicker noise is dominant at low frequencies and thermal noise is dominant at high frequencies. Flicker noise amplitude falls rapidly with frequency and is negligible after several kilohertz. Thermal noise is normally distributed with constant noise amplitude across the frequency range. The operating frequency of MAGFETs 60, 62, 64, and 66 may accordingly be in the kilohertz range as determined by quiescent current testing speed, but may alternatively be in any other suitable frequency range where appropriate. In order to defray some of the noise elements associated with the present invention, load capacitors (one for each differential output) may be positioned between MAGFET sensor 12 and stochastic sensor 14. In combination with the MAGFET output impedance (as described above), this creates a low pass filter to attenuate noise above the operating range of the present invention. For purposes of teaching additional details of stochastic sensor 14, reference is made to FIG. 7 in conjunction with FIG. 1.

Figure 7:
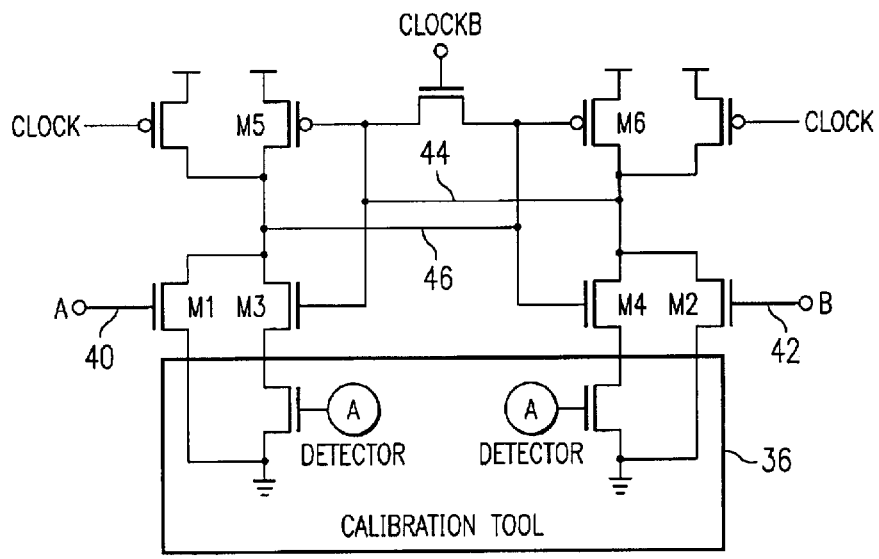
FIG. 7 is a circuit illustrating one embodiment of internal components within a stochastic sensor included within the quiescent current detection system of FIG. 1.

FIG. 7 illustrates additional details of the circuitry associated with stochastic sensor 14. As discussed above, the output voltage differential signal generated by MAGFET sensor 12 is provided to stochastic sensor 14. Stochastic sensor 14 performs the comparison of both input signals (communicated by links 40 and 42) and sends the results as either a "1" or a "0." In the operation of stochastic sensor 14, the sensing time is important as it will determine the clock cycle time and thus the quiescent current test speed. If the sensing time is too long for a given clock cycle time, first flip flop sensor 30 will have a high probability of remaining in a metastable state. This is equivalent to a don't know or error signal output rather than a "0" or a "1." According to the teachings of the present invention, this sensing time is minimized by adopting a two-stage stochastic sensor 14 (i.e., the cooperative functionality of first sensor 30 and second sensor 32) with each stage operating in an opposite clock phase of the other. This is illustrated by the circuitry of FIG. 7, however this circuitry may be varied considerably in order to produce any suitable type of analog to digital conversion for quiescent current detection system 10.

The first stage of stochastic sensor 14 is active during a clock high and disabled when clockb is high. The second stage will take the outputs of the first stage as inputs and be active during clockb high. During clockb high, the return of the first stage to the pre-powered state does not affect the second stage because the output of first flip-flop sensor 30 is connected to the gate input of the second stage. Using this two-stage approach, the available sensing time of stochastic sensor 14 becomes twice that of a single-stage sensor. Accordingly, the present invention contemplates that any number of sensors such as first flip flop sensor 30 and second flip flop sensor 32 may be implemented in order to effect greater precision in the measurement of quiescent current via the detection of an associated magnetic field.

The output of the second stage or second flip flop sensor 32 is provided to a counter within scan chain element 16, which counts the number of "1" values (in the case where an up counter is used) determined by the comparison between the voltage differential generated by MAGFET sensor 12 and noise. The counter, which resides in counter and scan chain element 16, produces a result that represents the relative magnitude of the quiescent current compared to a reference current. When the counter value is greater than half the number of cycles, this represents that the quiescent current is greater than the reference current. The scan chain provided in counter and scan chain element 16 may be used to send the counter value outside the integrated circuit or chip. During the scanning mode, the counter operates as a scan in register and is reset to "0." During normal operation of stochastic sensor 14, the counter within counter and scan chain element 16 operates as a counter, and in a successive scan outmode, outputs the counter results serially as a scan register.

In one embodiment, the calibration circuit comprises a charge pump attached to each of the two calibration pull-down transistors (the transistors with their gates connected to node A as illustrated in FIG. 7). Each charge pump includes a power-up circuit that initializes the charge pump output voltage to approximately half the power supply voltage. This is provided so that the calibration transistor will turn on and permit either first flip flop sensor 30 or second flip flop sensor 32 to operate when the calibration begins. This initialization is done with power up signals (PWRUP and PWRUPB) that initiate a resistive element.

In operation, once the output voltage has been initialized, the power up circuit turns off. To increase the voltage on the output, a pump up clock pulses low to store a voltage on a pump capacitor. This voltage is reduced from the power supply voltage by passing it through several diode-connected MOSFETs. Then the first pump clock pulses to transfer the charge on the pump capacitor to the output capacitance ($C_{rv}$). $C_{rv}$ is much larger than the pump capacitor so that the output voltage is adjusted by very small steps to achieve accurate calibration. A pump down path similar to the pump up path is provided to decrease the output voltage. It is operated by a pair of pump down clocks. The $C_{rv}$ capacitor is formed by the gate capacitance of two MOSFETs. Both PMOS and NMOS MOSFETs may be used to form the capacitor in order to balance the leakage paths through the gate oxides, increasing the time that quiescent current detection system 10 will stay in calibration. Each pump has its clocks connected in the opposite fashion, so that when one side pumps up, the other side pumps down. Additionally, the clocks are connected so that if the output of the flip flop is "1," the calibration voltages are adjusted so as to reduce the probability that a "1" will occur. If the output is a "0," then the voltages may be adjusted so as to increase the probability of a "1."

Because the signal to noise ratio of MAGFET sensor 12 may be lower than 1, and too small to be practically amplified by analog methods, the present invention implements stochastic sensor 14 in combination with a counter within counter and scan element 16 to convert the MAGFET sensor differential analog signal to a digital value. Stochastic sensor 14 achieves high sensitivity and high performance noise characteristics through repetition as a result of repeatedly performing a comparison of a measured signal and a random signal. Because the noise has a normal probability density function, MAGFET sensor 12 produces a random bit stream with a normal probability density function. This represents an equivalent indicator of the analog input signal.

Referring back to FIG. 1, calibration tool 36 is provided within stochastic sensor 14 in order to provide precise measurements of quiescent current by quiescent current detection system 10. Because quiescent current detection system 10 compares very small signals, any error produced will directly show up as an error in the quiescent current measurement. Generally, there are mismatches in the circuitry of stochastic sensor 14 and MAGFET sensor 12 caused by process variation and mismatches from layout design, for example. Recognizing these mismatches, stochastic sensor 14 offers the advantage of self-calibration. This self-calibration also offers the benefit of on-chip self calibration, which is presumptively superior to external calibration. On-chip calibration may be performed in parallel for all quiescent current sensing elements and avoids potential noise pickup associated with external signals during the calibration process.

The self-calibration protocol of stochastic sensor 14 is performed automatically using a charge pumping method executed by calibration tool 36. Input is repeatedly provided to calibration tool 36 through links 74 and 76 after the calibration mode has been initiated by a calibration signal 80. At a first step in the calibration process, the quiescent current is shut off, i.e., the power flowing to the integrated circuit is turned off. In the case where quiescent current detection system 10 is built in to an integrated circuit, this may require a separate power supply partition for the elements to be calibrated. At a next step, a bias stage is implemented and controlled by a power-up signal, which detects the stability of the power supply provided for the integrated circuit or chip. During the power-up sequence, the path from the power supply through the bias node to ground is effectively on and thus determines its final voltage (this circuitry is illustrated in FIG. 4). After power-up, the calibration will be executed using a calibration enable signal, calibration may be terminated externally by a calibration disable signal. During the calibration phase, a suitable number of clock cycles with no signal in MAGFET sensor 12 is provided in order to adjust the calibration voltages on internal elements within stochastic sensor 14, such as first flip-flop sensor 30 or second flip-flop sensor 32, for example. This produces a balancing affect or equilibrium within first flip-flop sensor 30 and second flip-flop sensor 32 allowing them to fall or resolve equally either to a "0" or a "1" in response to an input received from MAGFET sensor 12.

After stochastic sensor 14 completes calibration, the scan in mode is entered and counter and scan chain element 16 is reset to "0." Once the reset is provided, quiescent current detection system is completed with the calibration phase are ready for normal operation. Although quiescent current detection system 10 is described with reference to calibration tool 36, quiescent current detection system 10 may be calibrated in any other suitable manner where appropriate in accordance with the teachings of the present invention.

Despite the numerous elements within quiescent current detection system 10, including calibration tool 36, MAGFET sensor 12, etc., some embodiments of the present invention may be relatively small in size. This is important because space within an integrated circuit is generally at a premium in the semiconductor processing industry. One embodiment of the present invention may be implemented such that 1% or less of the space of the integrated circuit is occupied by quiescent current detection system 10. Alternatively, quiescent current detection system 10 may occupy additional space on an integrated circuit where appropriate or be suitably positioned external to the associated integrated circuit or chip according to particular needs.

Figure 8:
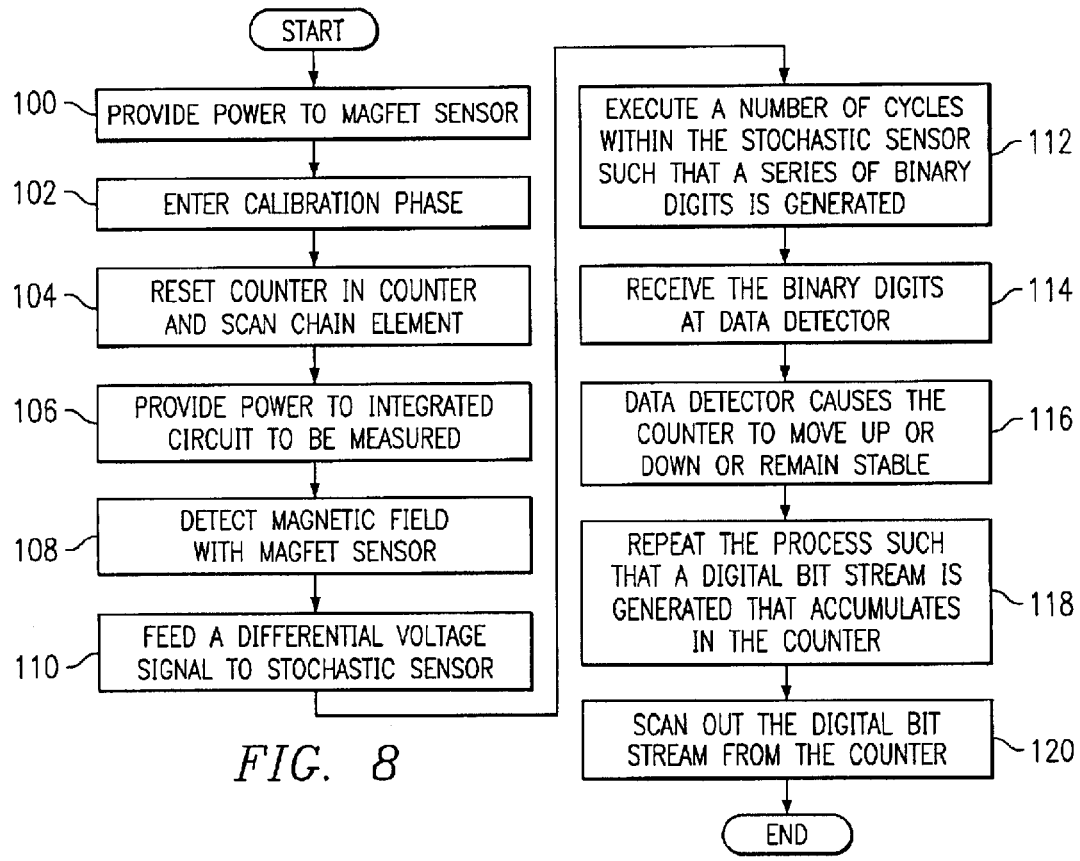
FIG. 8 is a flowchart illustrating a series of example steps associated with the quiescent current detection system of FIG. 1 in accordance with one embodiment of the present invention.

Turning to FIG. 8, FIG. 8 is a flow chart illustrating a series of steps associated with the operation of quiescent current detection system 10. The method begins at a first step 100 where power is provided to MAGFET sensor 12. The power provided triggers a power-up signal that initiates the calibration circuit (as described above). Additionally, a power-down signal may be provided such that when the calibration circuit is not operational, it is using only negligible or no power. At step 102, the calibration phase is begun. During the calibration phase, a suitable number of clock cycles with no signal in MAGFET sensor 12 is provided in order to adjust the calibration voltages on internal elements within stochastic sensor 14, such as first flip-flop sensor 30 or second flip-flop sensor 32, for example. This produces a balancing affect or equilibrium within first flip-flop sensor 30 and second flip-flop sensor 32 allowing them to fall equally either to a "0" or a "1" in response to an input received from MAGFET sensor 12.

Once the calibration phase is completed, a series of zeros are shifted into counter and scan chain element 16 such that the internal counter thereof may be reset. This is illustrated in FIG. 8 as step 104. At step 106, power may then be provided to the integrated circuit implementing quiescent current detection system 10. With the power provided, a leakage current (the quiescent current sought to be measured) may begin to flow. It is important to note that there is no degradation or hindrance in circuit performance as power is provided to the integrated circuit being measured. This is because quiescent current detection system 10 is indirectly sensing current flow via the magnetic field generated by the quiescent current.

At step 108, MAGFET sensor 12 senses magnetic fields generated by the quiescent current of the integrated circuit and amplifies the leakage current before converting it to a differential voltage. This differential voltage signal is fed to a stochastic sensor 14 at step 110. First flip-flop sensor 30 receives this differential voltage via links 40 and 42. At step 112, a number of cycles are executed within stochastic sensor 14 such that a series of binary digits is generated by first flip-flop sensor 30, second flip-flop sensor 32, and data detector 34. First flip-flop sensor 30 begins to flip part of the way toward a "0" or a "1" and then second flip-flop sensor 32 reads this signal via links 44 and 46 and flips the rest of the way toward either a "0" or a "1."

At step 114, data detector 34 receives the binary digits communicated by second flip-flop sensor 32 via links 48 and 50. From second flip-flop sensor 32, a determination has been made whether second flip-flop sensor 32 flipped to a "0" or a "1." This "0" or "1" is communicated to data detector 34 that in turn causes the counter within counter and scan chain element 16 to count up one or not count at all (or if an up-down counter is implemented, it will count up or count down accordingly). This is illustrated generally in FIG. 8 at step 116. At step 118, this process is repeated such that a digital bit stream is generated that accumulates in the counter within counter and scan chain element 16. The counter value is approximately equivalent to the number of clock cycles times the probability of getting a "1" or a "0" out of second flip-flop sensor 32. This is the digital signal or format of the differential voltage output of MAGFET sensor 12. At step 120, the digital bit stream is scanned from the counter. Simultaneously, a series of zeros may be scanned into the counter via scan in communications link 56 such that the counter is reset. The information that is scanned out may be further processed or otherwise communicated to any component element or device operable to display, process or communicate the information. Scan out communications link 54 may feed a pin on the integrated circuit or chip in providing the digitized information at that location.

Although several embodiments of the invention have been illustrated and described in detail, it will be understood that various substitutions and alterations can be made therein without departing from this present invention. For example, although the present invention is described in terms of CMOS technology, alternate implementations may be developed using any semiconductor technology such as Gallium Arsenide (GaAs), for example. In addition, there are a host of possible layouts or configurations for MAGFET sensor 12 in order to reduce noise effects and increase gain. The present invention contemplates that any MAGFET sensor or other sensing element may be used such that noise effects are eliminated or otherwise reduced or such that the gain or sensitivity of the sensor is increased.

In addition, although the present invention describes MAGFET orientations as being cross-coupled or oriented with respect to drain considerations, any suitable configuration or alignment may be implemented in accordance with the teachings of the present invention. FIG. 3 only offers one embodiment of MAGFET sensor 12, numerous other configurations that sense magnetic fields may be implemented according to particular needs. Similarly, counter and scan chain element 16 may be configured any number of ways in order to provide an interface between stochastic sensor 14 and an element that receives the digital bit stream representative of the quiescent current of an integrated circuit or chip.

Stochastic sensor 14 may similarly be configured or implemented in any number of suitable ways. Various internal components may be eliminated from stochastic sensor 14 or provided external thereto. Additional components such as additional flip-flop sensors or any other logic elements may be provided where appropriate in order to effect the generation of a binary result to be communicated to data detector 34. For smaller circuit size specifications, the second stage of stochastic sensor 14 may be eliminated entirely. Other suitable configurations that operate to effect a suitable analog to digital conversion may be implemented where appropriate and according to particular needs.

In addition, stochastic sensor 14 may be eliminated entirely in accordance with the teachings of the present invention. In such an embodiment, a measurement is taken of the voltage drop along a power or ground line, feeding this voltage difference directly into stochastic sensor 14 without using MAGFET sensor 12. This implementation is also noninvasive because the voltage drop is inherent to the supply lines due to their finite resistance.

Additionally, there are several variations in self-calibration methods, components, and elements that may be used in order to effect precision measurement of quiescent currents in accordance with the teachings of the present invention. For example, rather than placing the calibration transistors in series, the transistors may be placed in parallel. In the case of a floating-gate MOSFET technology element, such as a flash process for example, calibration tool 36 may be implemented to program the gate voltage of calibration transistors of stochastic sensor 14.

Moreover, although quiescent current detection system 10 has been illustrated as provided within an integrated circuit or chip, quiescent current detection system 10 may be provided external to an integrated circuit or chip or in any suitable location where appropriate and according to particular needs.

Numerous other changes, substitutions, variations, alternations, and modifications may be suggested to one skilled in the art, and it is intended that the present invention encompass all such changes, substitutions, variations, alternations, and modifications as falling within the spirit and scope of the appended claims.

What is claimed is:

1. A method for detecting quiescent current in an integrated circuit, comprising:
   detecting a magnetic field generated by the quiescent current and in response generating a magnetic field signal that is indicative of the detected magnetic field;
   amplifying the magnetic field signal;
   converting the magnetic field signal into a differential voltage signal;
   converting the differential voltage signal into a digital format; and
   wherein converting the differential voltage signal to a digital format comprises converting the differential voltage signal into a digital bit stream that is communicated to a counter such that an accumulated result is generated in the counter, the accumulated result representing the approximate Gaussian distribution of the magnetic field signal.

2. The method of claim 1, wherein conversion of the differential voltage signal into the digital bit stream is performed using a stochastic process that repeatedly compares the differential voltage signal and background noise and that amplifies the difference between the differential voltage signal and the background noise.

3. The method of claim 1, further comprising scanning out the converted differential voltage in its digital format to a processing element.

4. The method of claim 1, further comprising receiving the differential voltage signal at one or more flip flops, each of the flip flops operable to compare the differential voltage signal and background noise and in response to the comparison flip in order to produce a selected binary digit.

5. The method of claim 4, further comprising receiving and reading the selected binary digit with a data detector operable to provide a signal to a counter based on the operation of the flip flop, the counter operable to store a digital bit stream that reflects a series of comparisons between the differential voltage signal and the background noise.

6. The method of claim 1, further comprising executing a calibration cycle before initiating detection of the magnetic field generated by the quiescent current, the calibration cycle comprising a plurality of clock cycles that generate a zero magnetic field signal that produces a magnetic field sensing equilibrium before detection of the magnetic field commences.

7. An apparatus for detecting quiescent current in an integrated circuit, comprising:
   a magnetic field sensing element operable to detect a magnetic field generated by the quiescent current and to generate a magnetic field signal indicative of the magnetic field, the magnetic field sensing element being further operable to amplify the magnetic field signal and convert the magnetic field signal into a differential voltage signal;

a stochastic sensor operable to convert the differential voltage signal into a digital format; and wherein the stochastic sensor comprises one or more flip flops operable to receive the differential voltage signal, each of the flip flops operable to compare the differential voltage signal and background noise and in response to the comparison flip in order to produce a selected binary digit.

8. The apparatus of claim 7, wherein the magnetic field sensing element is a magnetic field effect transistor (MAGFET) sensor.

9. The apparatus of claim 8, wherein the MAGFET sensor comprises two P-type and two N-type MAGFETs.

10. The apparatus of claim 9, wherein the P-type and N-type MAGFETs are arranged in a cross-coupled configuration and oriented such that in the presence of the magnetic field a drain associated with a selected one of the P-type MAGFETs having an increased current as a result of the magnetic field is coupled to a drain associated with a selected one of the N-type MAGFETs having a decreased current as a result of the magnetic field.

11. The apparatus of claim 8, further comprising a low-pass filter coupled to a selected one or more of a plurality of MAGFET sensor outputs, the low-pass filter operable to reduce noise.

12. The apparatus of claim 7, further comprising a counter operable to receive a digital bit stream that reflects a comparison between the differential voltage signal and background noise.

13. The apparatus of claim 12, further comprising a processing element operable to scan out the digital bit stream that reflects a comparison between the differential voltage signal and background noise.

14. The apparatus of claim 7, wherein the stochastic sensor executes a stochastic process that repeatedly compares the differential voltage signal and background noise and that amplifies the difference between the signal and the background noise for further processing.

15. The apparatus of claim 14, further comprising a counter operable to receive a digital bit stream that reflects a comparison between the differential voltage signal and background noise.

16. The apparatus of claim 15, further comprising a processing element operable to scan out the digital bit stream that reflects a comparison between the differential voltage signal and background noise.

17. The apparatus of claim 14, wherein the stochastic sensor further comprises a calibration tool operable to execute a calibration cycle before initiating detection of the magnetic field generated by the quiescent current, the calibration cycle comprising a plurality of clock cycles that generate a zero magnetic field signal that is fed to internal components of the stochastic sensor such that a magnetic field sensing equilibrium is reached.

18. The apparatus of claim 7, wherein the stochastic sensor further comprises a data detector operable to receive and to read the selected binary digit, the data detector being further operable to provide a signal to a counter based on the operation of the flip flop, the counter storing a digital bit stream that reflects a series of comparisons between the differential voltage signal and the background noise.

19. A method for detecting quiescent current in an integrated circuit, comprising:

detecting a magnetic field generated by the quiescent current and in response generating a magnetic field signal that is indicative of the detected magnetic field;

amplifying the magnetic field signal;

converting the magnetic field signal into a differential voltage signal;

converting the differential voltage signal into a digital bit stream using a stochastic process that repeatedly compares the differential voltage signal and background noise and that amplifies the difference between the differential voltage signal and the background noise, the digital bit stream being communicated to a counter such that an accumulated result is generated in the counter, the accumulated result representing the approximate Gaussian distribution of the magnetic field signal; and scanning out the digital bit stream to a processing element.

20. An apparatus for detecting quiescent current in an integrated circuit, comprising:

a magnetic field effect transistor (MAGFET) sensor that comprises two P-type and two N-type MAGFETs and that is operable to detect a magnetic field generated by the quiescent current and to generate a magnetic field signal indicative of the magnetic field, the MAGFET sensor being further operable to amplify the magnetic field signal and convert the magnetic field signal into a differential voltage signal, wherein the MAGFETs are arranged in a cross-coupled configuration and oriented such that in the presence of the magnetic field a drain associated with a selected one of the P-type MAGFETs having an increased current as a result of the magnetic field is coupled to a drain associated with a selected one of the N-type MAGFETs having a decreased current as a result of the magnetic field;

a stochastic sensor operable to convert the differential voltage signal into a digital format;

a counter operable to receive a digital bit stream that reflects a comparison between the differential voltage signal and background noise; and a processing element operable to scan out the digital bit stream that reflects a comparison between the differential voltage signal and background noise.

21. An apparatus for detecting quiescent current in an integrated circuit, comprising:

a magnetic field sensing element operable to detect a magnetic field generated by the quiescent current and to generate a magnetic field signal indicative of the magnetic field, the magnetic field sensing element being further operable to amplify the magnetic field signal and convert the magnetic field signal into a differential voltage signal; and a stochastic sensor operable to convert the differential voltage signal into a digital format, wherein the stochastic sensor executes a stochastic process that repeatedly compares the differential voltage signal and background noise and that amplifies the difference between the signal and the background noise for further processing, and wherein the stochastic sensor comprises one or more flip flops operable to receive the differential voltage signal, each of the flip flops operable to compare the differential voltage signal and background noise and in response to the comparison flip in order to produce a selected binary digit.

22. An integrated circuit, comprising:

a quiescent current detection system, the system comprising:

a magnetic field effect transistor (MAGFET) sensor that comprises two P-type and two N-type MAGFETs and that is operable to detect a magnetic field generated by the quiescent current and to generate a magnetic field signal indicative of the magnetic field, the MAGFET sensor being further operable to amplify the magnetic field signal and convert the magnetic field signal into a differential voltage signal, wherein the MAGFETs are arranged in a cross-coupled configuration and oriented such that in the presence of the magnetic field a drain associated with a selected one of the P-type MAGFETs having an increased current as a result of the magnetic field is coupled to a drain associated with a selected one of the N-type MAGFETs having a decreased current as a result of the magnetic field, a stochastic sensor operable to convert the differential voltage signal into a digital format, a counter operable to receive a digital bit stream that reflects a comparison between the differential voltage signal and background noise, and a processing element operable to scan out the digital bit stream that reflects a comparison between the differential voltage signal and background noise.

23. An integrated circuit, comprising:

a quiescent current detection system, the system comprising:

a magnetic field sensing element operable to detect a magnetic field generated by the quiescent current and to generate a magnetic field signal indicative of the magnetic field, the magnetic field sensing element being further operable to amplify the magnetic field signal and convert the magnetic field signal into a differential voltage signal, and a stochastic sensor operable to convert the differential voltage signal into a digital format, wherein the stochastic sensor executes a stochastic process that repeatedly compares the differential voltage signal and background noise and that amplifies the difference between the signal and the background noise for further processing, and wherein the stochastic sensor comprises one or more flip flops operable to receive the differential voltage signal, each of the flip flops operable to compare the differential voltage signal and background noise and in response to the comparison flip in order to produce a selected binary digit.

24. An apparatus for detecting quiescent current in an integrated circuit, comprising a stochastic sensor operable to receive a differential voltage signal indicative of a quiescent current generated by the integrated circuit, wherein the stochastic sensor converts the differential voltage signal into a digital format that represents a digital value associated with the quiescent current; and wherein the stochastic sensor comprises one or more flip flops operable to receive the differential voltage signal, each of the flip flops operable to compare the differential voltage signal and background noise and in response to the comparison flip in order to produce a selected binary digit.

25. The apparatus of claim 24, wherein the stochastic sensor executes a stochastic process that repeatedly compares the differential voltage signal and background noise and that amplifies the difference between the signal and the background noise for further processing.

26. The apparatus of claim 24, wherein the stochastic sensor further comprises a data detector operable to receive and to read the selected binary digit, the data detector being further operable to provide a signal to a counter based on the operation of the flip flop, the counter storing a digital bit stream that reflects a series of comparisons between the differential voltage signal and the background noise.

27. The apparatus of claim 24, further comprising a counter operable to receive a digital bit stream that reflects a comparison between the differential voltage signal and background noise.

28. The apparatus of claim 27, further comprising a processing element operable to scan out the digital bit stream that reflects a comparison between the differential voltage signal and background noise.

29. The apparatus of claim 24, wherein the stochastic sensor further comprises a calibration tool operable to execute a calibration cycle, the calibration cycle comprising a plurality of clock cycles that generate a zero magnetic field signal that is fed to internal components of the stochastic sensor such that a magnetic field sensing equilibrium is reached.

* * * * *